(12) United States Patent
De Paoli et al.

(10) Patent No.: US 7,990,023 B2
(45) Date of Patent: Aug. 2, 2011

(54) ARRANGEMENT WITH A COATED PIEZOELECTRIC ACTUATOR

(75) Inventors: Albano De Paoli, Muehlacker (DE); Stefan Schuerg, Ludwigsburg (DE); Wolfgang Stoecklein, Waiblingen (DE); Holger Rapp, Ditzingen (DE); Thomas Pauer, Freiberg (DE); Friedrich Boecking, Stuttgart (DE); Marco Holst, Stuttgart (DE); Helmut Sommariva, Graz (AT); Claudia Klotz, Bamberg (DE); Peter Cromme, Bamberg (DE)

(73) Assignee: Robert Bosch GmbH, Stuttgart (DE)

( * ) Notice: Subject to any disclaimer, the term of this patent is extended or adjusted under 35 U.S.C. 154(b) by 245 days.

(21) Appl. No.: 12/303,401

(22) PCT Filed: May 22, 2007

(86) PCT No.: PCT/EP2007/054920
§ 371 (c)(1),
(2), (4) Date: Dec. 4, 2008

(87) PCT Pub. No.: WO2007/141134
PCT Pub. Date: Dec. 13, 2007

(65) Prior Publication Data
US 2009/0199379 A1      Aug. 13, 2009

(30) Foreign Application Priority Data
Jun. 6, 2006  (DE) .................. 10 2006 026 152

(51) Int. Cl.
*H01L 41/083* (2006.01)
(52) U.S. Cl. ........................ 310/328; 310/340
(58) Field of Classification Search .................. 310/328, 310/340
See application file for complete search history.

(56) References Cited

U.S. PATENT DOCUMENTS

| | | | |
|---|---|---|---|
| 3,360,665 A * | 12/1967 | Boswell | 310/328 |
| 4,958,100 A * | 9/1990 | Crawley et al. | 310/328 |
| 5,438,232 A * | 8/1995 | Inoue et al. | 310/328 |
| 5,455,477 A * | 10/1995 | Sano et al. | 310/328 |
| 6,274,967 B1 * | 8/2001 | Zumstrull et al. | 310/328 |
| 6,315,216 B1 * | 11/2001 | Boecking | 239/102.2 |
| 6,333,587 B1 * | 12/2001 | Heinz et al. | 310/328 |
| 6,359,373 B1 * | 3/2002 | Buckley et al. | 310/328 |
| 6,420,817 B1 | 7/2002 | Ricci-Ottati et al. | |
| 6,552,472 B1 * | 4/2003 | Heinz | 310/328 |
| 6,661,158 B2 * | 12/2003 | Kawazoe | 310/328 |
| 6,685,113 B1 * | 2/2004 | Ruehle et al. | 239/585.1 |

(Continued)

FOREIGN PATENT DOCUMENTS
EP         1574702 A1    9/2005

*Primary Examiner* — Thomas M Dougherty
(74) *Attorney, Agent, or Firm* — Ronald E. Greigg

(57) ABSTRACT

An arrangement is proposed for forming a piezoelectric actuator, which has at least one piezoelectric element that in each case consists of a multi-layer structure of piezoelectric-layers, wherein internal electrodes arranged between the piezoelectric-layers in the direction of the build-up of the layers of the piezoelectric element, have an electrical voltage of different polarity alternately applied to them. Around the piezoelectric element, or in the case of multiple piezoelectric elements positioned in series in the activation direction, around the piezoelectric elements, and at least partially around the actuator head and the actuator foot there is arranged a covering system made from at least one layer of an insulating material. The at least one layer encloses the joints between the piezoelectric element or elements and the actuator head and the actuator foot, forming a seal.

14 Claims, 1 Drawing Sheet

U.S. PATENT DOCUMENTS

| | | | |
|---|---|---|---|
| 6,700,308 B2 * | 3/2004 | Heinz | 310/328 |
| 6,781,289 B2 * | 8/2004 | Heinz et al. | 310/346 |
| 6,845,920 B2 * | 1/2005 | Sato et al. | 239/102.1 |
| 7,595,579 B2 * | 9/2009 | Heinz et al. | 310/323.01 |
| 2002/0084872 A1 | 7/2002 | Kawazoe | |
| 2002/0123592 A1 | 9/2002 | Zhang et al. | |
| 2004/0113525 A1 | 6/2004 | Hardy et al. | |
| 2004/0178701 A1 * | 9/2004 | Sato et al. | 310/328 |
| 2005/0199745 A1 * | 9/2005 | Berlemont | 239/88 |

* cited by examiner

ARRANGEMENT WITH A COATED PIEZOELECTRIC ACTUATOR

CROSS-REFERENCE TO RELATED APPLICATION

This application is a 35 USC 371 application of PCT/EP 2007/054920 filed on May 22, 2007.

BACKGROUND OF THE INVENTION

1. Field of the Invention

The invention relates to an arrangement having a coated piezoelectric actuator with at least one piezoelectric element.

2. Description of the Prior Art

It is known per se that for constructing the aforementioned piezoelectric actuator, a piezoelectric element can be used in such a way that by utilizing what is know as the piezoelectric effect the needle stroke of a valve or the like can be controlled. The piezoelectric element is constructed of a material with a suitable crystalline structure such that upon application of an external electrical voltage, a mechanical reaction of the piezoelectric element ensues, which depending on the crystalline structure and the regions where the electrical voltage is applied represents compression or tension in a predeterminable direction. Such piezoelectric actuators are suitable for instance for applications in which reciprocating motions take place under strong actuation forces and at high pulse frequencies.

For instance, one such piezoelectric actuator is known as a component of a piezoelectric injector from German Patent Disclosure DE 10026005 A1, which can be used to trigger the nozzle needle in injectors for injecting fuel into the combustion chamber of an internal combustion engine. In this piezoelectric actuator, a piezoelectric element is constructed as a stack of a plurality of electrically coupled-together piezoceramic layers, and this stack is held between two stops by prestressing, via an actuator foot and an actuator head. Each piezoceramic layer is fixed between two inner electrodes, by way of which an electrical voltage can be applied from outside. Because of this electrical voltage, the piezoceramic layers then each execute short reciprocating motions in the direction of the potential drop, and these motions add together to make the total stroke of the piezoelectric actuator. This total stroke is variable by way of the level of the voltage applied and can be transmitted to a mechanical final control element.

Such known arrangements are often used as so-called common rail systems for injecting fuel into direct-injection diesel engines. In these systems known as common rail injectors, the injection pressure can be adapted easily to the load and rpm of the engine.

These common rail injectors may be constructed such that there is a nozzle needle controlled directly by the piezoelectric actuator, and the piezoelectric actuator is surrounded directly or indirectly by the pressure of the fuel, and between the nozzle needle and the piezoelectric actuator, a hydraulic coupling chamber is provided. It is important here that the relatively vulnerable piezoelectric actuator, in the internal volume of a holder body that is filled with fuel at high pressure, be neither attacked nor destroyed by that fuel.

Various methods for sealing off the piezoelectric actuator, especially if it is located in the low-pressure region of a piezoelectric injector, from the surrounding medium are known per se. For instance, such a piezoelectric actuator can be encapsulated in a stable metal sheath, and the actuator head, which transmits the stroke and the force of the piezoelectric actuator to the outside, is located on the mechanically active end face of the piezoelectric actuator. This actuator head is then connected to the stable sheath via a diaphragm. As a result, the diaphragm creates a flexible, tight connection between the actuator head and the sheath.

In an application of the piezoelectric actuator in the high-pressure range of a piezoelectric injector, however, the aforementioned embodiment is disadvantageous with regard to the strength of the diaphragm as well as the strength of the sheath. From German Patent disclosure DE 10217361 A1, an embodiment is known in which a single piezoelectric actuator is first coated on portions of its surface with an organic base layer, which in turn is provided with an inorganic cover layer that has the task of sealing off the base layer from the surrounding fuel that would otherwise attack the organic base layer.

It is furthermore known, for instance from International Patent Disclosure WO 0261856 A1, that in connection with a piezoelectric actuator, a shrink-fit hose is first slipped over the piezoelectric element and the actuator foot and the actuator head. Next, the interstice between the shrink-fit hose and the piezoelectric actuator is filled with a filler material, and finally, the shrink-fit hose is shrunk by thermal action and as a result the piezoelectric actuator and the filler material are tightly enclosed.

As a rule, these known arrangements can be realized only with very great effort and high expense.

ADVANTAGES AND SUMMARY OF THE INVENTION

The invention is based on an arrangement described at the outset for forming a piezoelectric actuator that has at least one piezoelectric element, each piezoelectric element comprising a multilayer construction of piezoelectric layers, inner electrodes disposed between the piezoelectric layers are subjected in alternation, in the direction of the layer structure of the piezoelectric element, to a different polarity of an electrical voltage. In addition, an insulating medium, surrounding at least the piezoelectric layers, and an actuator head and an actuator foot on the ends of the piezoelectric element are present. A piezoelectric actuator formed by this arrangement can preferably be a component of a piezoelectric injector mentioned at the outset for an injection system for fuel in an internal combustion engine, in which the fuel bathes the coated piezoelectric actuator.

According to the invention, a cover layer system of at least one ply of the insulation material is advantageously disposed around the piezoelectric element or elements and at least partially around the actuator head and the actuator foot. The at least one ply also sealingly surrounds the joining points between the piezoelectric element or elements and the actuator head and the actuator foot. The plies of the cover layer system are preferably made from a plastic material.

In an advantageous embodiment, the piezoelectric actuator is constructed of at least two piezoelectric elements located in series in the actuation direction, which are joined to one another and to the actuator head and the actuator foot via inactive regions, that is, regions without inner electrodes that are subjected to voltage. As a rule, the actuator head and actuator foot are made from a metal or ceramic material.

A connection between the at least one ply of the cover layer system and the piezoelectric element or elements as well as the actuator head and the actuator foot is advantageously formed at least partially by positive engagement. However, depending on the application, a chemical compound or an adhesion promoter can also be considered, which can also be located between the plies in a multi-ply cover layer system.

Advantageously, in a multi-ply cover layer system, it is also possible for a plurality of plies to be disposed only partially in the course of the surface, but at every point on the surface of the piezoelectric element or elements and at least partially around the actuator head and the actuator foot, there must be at least one ply of the insulation material.

In a further advantageous embodiment, in a multi-ply cover layer system, at least the ply located directly on the surface of the piezoelectric element or elements and around the actuator head and the actuator foot is formed of an elastic material, which goes along with a longitudinal expansion caused for instance by the stroke of the piezoelectric actuator. This is attained by means of a suitable modulus of elasticity of this ply, so that mechanical stresses on the outer surface of the cover layer system are then minimized.

Also in a multi-ply cover layer system, at least the ply directly on the surface of the piezoelectric element or elements can be designed such that it does not adhere there but instead that a relative motion of the ply with respect to the surface of the respective piezoelectric element and/or among the various layers can be executed.

The material comprising the cover layer system can advantageously be selected such that at least the ply located on the surface of the piezoelectric element or elements is formed of electrical insulation material. At least in some portions, however, this material may also be electrically conductive material.

Moreover, in a simple way, a connection between the piezoelectric elements among one another and/or between the piezoelectric elements and the actuator head and/or the actuator foot can be made by positive engagement, by nonpositive engagement, or by adhesive bonding.

BRIEF DESCRIPTION OF THE DRAWINGS

Exemplary embodiments of the piezoelectric actuator of the invention will be described in conjunction with the drawings, in which.

DESCRIPTION OF THE PREFERRED EMBODIMENTS

Figures 1, 2, 3:
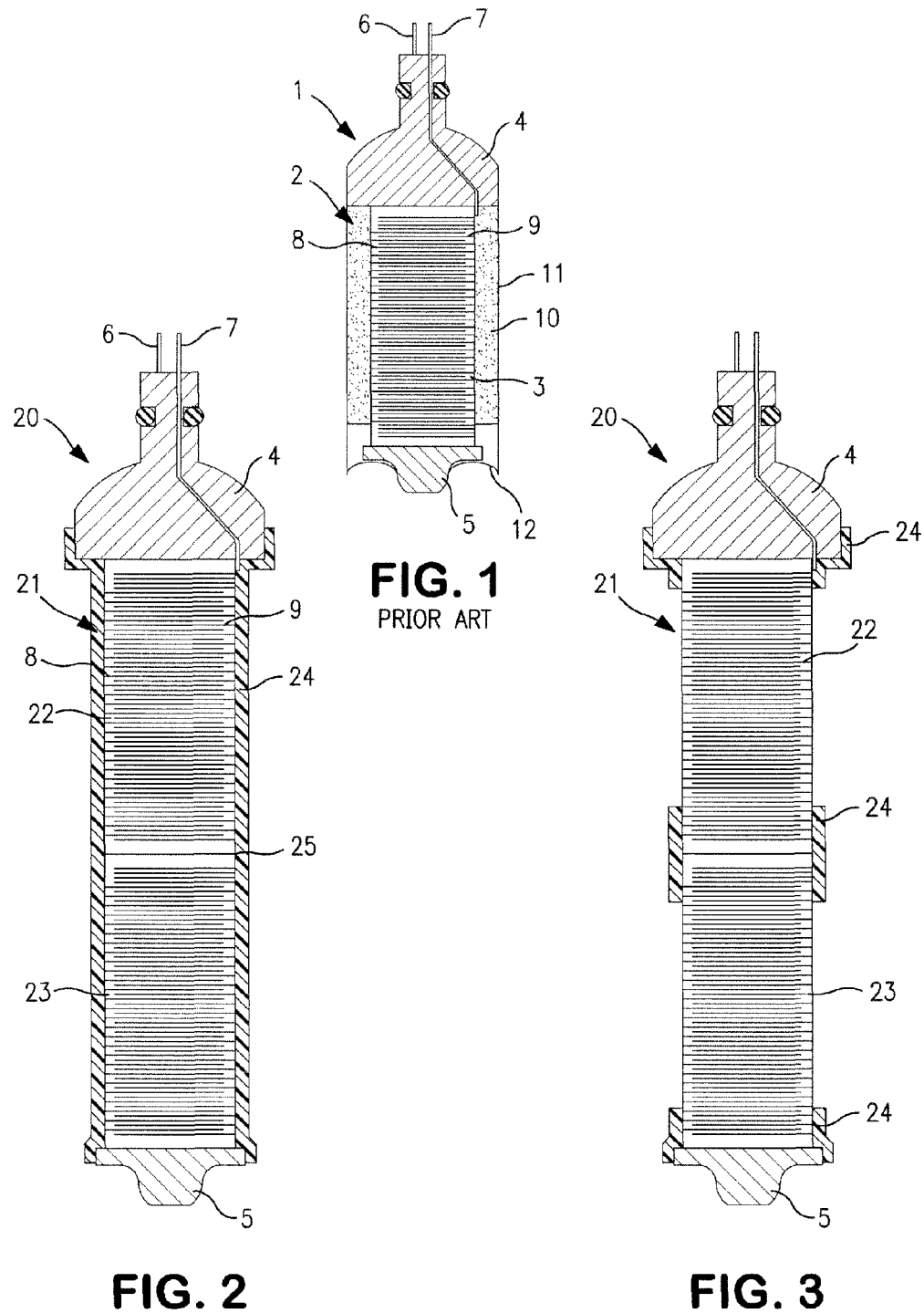
FIG. 1 shows a section through a piezoelectric actuator with a sheath and a diaphragm in accordance with the prior art.
FIG. 2 shows a section through a piezoelectric actuator of the invention, sheathed by a single- or multi-ply cover layer system, that has two piezoelectric elements connected in series with one another.
FIG. 3 shows a section through a piezoelectric actuator of the invention that in a modification of FIG. 2 is only partially sheathed with a single- or multi-ply cover layer system.

In FIG. 1, a conventional arrangement 1, known per se, with a piezoelectric actuator 2 is shown in the fuel injection system in an internal combustion engine. A piezoelectric element 3 is a component of the piezoelectric actuator 2, and the latter also has an actuator foot 4 and an actuator head 5, for instance of steel. Electrical lead lines 6 and 7 are extended through the actuator foot 4 and contacted, via outer electrodes not shown further here, with inner electrodes 8 and 9 in the piezoelectric element 3. Upon an actuation of the piezoelectric actuator 2 by imposition of voltage on the inner electrodes 8 and 9, a mechanical arrangement, in this case located perpendicularly below the actuator head 5, can be actuated in such a way that in this case an uncovering of a nozzle opening of the injection system can be effected.

The arrangement 1 having the piezoelectric actuator 2 is installed in an injector body, not shown here; the fuel is carried through the interior of the injector body, past the arrangement 1. This fuel can then, for instance in a so-called common rail system, be injected into the combustion chamber of an internal combustion engine, not shown here, either at the rail pressure mentioned in the background section or at some other predeterminable pressure.

To protect the piezoelectric actuator 2 of FIG. 1 from the fuel bathing it and from other harmful effects, an insulation layer 10 is present, which in turn is closed with a sheath 11 and a diaphragm 12.

In FIG. 2, an arrangement 20 according to the invention can be seen, in which a piezoelectric actuator 21 is formed of two piezoelectric elements 22 and 23, which are connected in series in the actuation direction. The two piezoelectric elements 22 and 23 are joined together on respective inactive ends by a suitable method, and an electrical connection 25 is also made for connecting the outer electrodes. A cover layer system 24 comprising at least one ply of an insulation material is formed here that is wrapped at least partially around the actuator foot 4 and the actuator head 5 as well.

In a further exemplary embodiment in FIG. 3, the cover layer system 24 is mounted only at the joining points between the piezoelectric elements 22 and 23 and at the connections of the piezoelectric elements 22 and 23 with the actuator foot 4 and the actuator head 5.

The cover layer system 24 according to the invention comprising one or more plies of an insulation material can be adapted simply to the particular geometric demands involved in order to achieve protection of the piezoelectric actuator 21 within the available installation space in the holder body of the aforementioned piezoelectric injector.

The cover layer system 24 may be formed of an elastic material, which goes along with a longitudinal expansion caused by the stroke of the piezoelectric actuator 21. On the other hand, adhesion to the surface of the piezoelectric actuator 21 can also be dispensed with, so that a relative motion can be executed between the ply of the cover layer system 24 and the surface of the respective piezoelectric element 22 and/or 23 and/or among the various plies.

The foregoing relates to the preferred exemplary embodiments of the invention, it being understood that other variants and embodiments thereof are possible within the spirit and scope of the invention, the latter being defined by the appended claims.

The invention claimed is:

1. A piezoelectric actuator comprising:
   at least one piezoelectric element having a multilayer construction of piezoelectric layers;
   an actuator head disposed on an end of the at least one piezoelectric element;
   an actuator foot disposed on an other end of at least one piezoelectric element;
   a cover layer system including at least one ply of the insulation material disposed around the at least one piezoelectric element, or multiple piezoelectric elements located in series in an actuation direction, the at least one ply disposed at least partially around the actuator head and the actuator foot, and the at least one ply sealingly surrounding joining points between the piezoelectric element or piezoelectric elements and the actuator head and the actuator foot,
   wherein the cover layer system is a multi-ply cover layer system, a plurality of plies are present only in part, and there is at least one ply of the insulation material at each point on the surface of the piezoelectric element or piezoelectric elements and at least partially around the actuator head and the actuator foot, and wherein in the multi-ply cover layer system, at least a ply on a surface of the piezoelectric element or the piezoelectric elements does not adhere, so that a relative motion of the ply relative to the surface of the respective piezoelectric element, and/or of plies to one another, can be executed.

2. A piezoelectric actuator as defined by claim 1, wherein the piezoelectric actuator is constructed of at least two piezoelectric elements located in series in the actuation direction, which are joined via inactive regions to one another and to the actuator head and the actuator foot.

3. A piezoelectric actuator as defined by claim 1, wherein a connection between the at least one ply of the cover layer system and the piezoelectric element or piezoelectric elements as well as the actuator head and the actuator foot is formed at least partially by positive engagement.

4. A piezoelectric actuator as defined by claim 2, wherein a connection between the at least one ply of the cover layer system and the piezoelectric element or piezoelectric elements as well as the actuator head and the actuator foot is formed at least partially by positive engagement.

5. A piezoelectric actuator as defined by claim 1, wherein a connection between the at least one ply of the cover layer system and the piezoelectric element or piezoelectric elements as well as the actuator head and the actuator foot is formed at least partially by a chemical bond.

6. A piezoelectric actuator as defined by claim 2, wherein a connection between the at least one ply of the cover layer system and the piezoelectric element or piezoelectric elements as well as the actuator head and the actuator foot is formed at least partially by a chemical bond.

7. A piezoelectric actuator as defined by claim 1, wherein a connection between the at least one ply of the cover layer system and the piezoelectric element or piezoelectric elements as well as the actuator head and the actuator foot and/or in a multi-ply cover layer system between plies thereof is formed at least partially by an adhesion promoter.

8. A piezoelectric actuator as defined by claim 2, wherein a connection between the at least one ply of the cover layer system and the piezoelectric element or piezoelectric elements as well as the actuator head and the actuator foot and/or in a multi-ply cover layer system between plies thereof is formed at least partially by an adhesion promoter.

9. A piezoelectric actuator as defined by claim 7, wherein in the multi-ply cover layer system, a plurality of plies are present only in part, and there is at least one ply of the insulation material at each point on the surface of the piezoelectric element or piezoelectric elements and at least partially around the actuator head and the actuator foot.

10. A piezoelectric actuator defined by claim 8, wherein in the multi-ply cover layer system, a plurality of plies are present only in part, and there is at least one ply of the insulation material at each point on the surface of the piezoelectric element or piezoelectric elements and at least partially around the actuator head and the actuator foot.

11. A piezoelectric actuator as defined by claim 7, wherein in the multi-ply cover layer system, at least a ply on a surface of the piezoelectric element or the piezoelectric elements does not adhere, so that a relative motion of the ply relative to the surface of the respective piezoelectric element, and/or of plies to one another, can be executed.

12. A piezoelectric actuator as defined by claim 1, wherein at least a ply on a surface of the piezoelectric element or the piezoelectric elements is formed of electrical insulation material.

13. A piezoelectric actuator as defined by claim 1, wherein a connection between the piezoelectric elements among one another and/or between the piezoelectric elements and the actuator head and/or the actuator foot is formed by positive engagement, by nonpositive engagement, or by adhesive bonding.

14. A piezoelectric actuator defined by claim 1, wherein the piezoelectric actuator is a component of a piezoelectric injector for an injection system for fuel in an internal combustion engine, in which the fuel bathes the cover layer system.

* * * * *